United States Patent
Tsubaki

(10) Patent No.: US 12,322,624 B2
(45) Date of Patent: Jun. 3, 2025

(54) STORAGE SHELF

(71) Applicant: Murata Machinery, Ltd., Kyoto (JP)

(72) Inventor: Tatsuo Tsubaki, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 532 days.

(21) Appl. No.: 17/908,145

(22) PCT Filed: Jan. 19, 2021

(86) PCT No.: PCT/JP2021/001632
§ 371 (c)(1),
(2) Date: Aug. 30, 2022

(87) PCT Pub. No.: WO2021/176865
PCT Pub. Date: Sep. 10, 2021

(65) Prior Publication Data
US 2023/0134774 A1    May 4, 2023

(30) Foreign Application Priority Data

Mar. 5, 2020 (JP) .................................. 2020-037929

(51) Int. Cl.
*H01L 21/673* (2006.01)
*B65G 1/02* (2006.01)

(52) U.S. Cl.
CPC .......... *H01L 21/67389* (2013.01); *B65G 1/02* (2013.01); *B65G 2201/0297* (2013.01)

(58) Field of Classification Search
CPC ................ H01L 21/67389; B65G 1/02; B65G 2201/0297

(Continued)

(56) References Cited

U.S. PATENT DOCUMENTS 5,307,568 A * 5/1994 Matsuo ............. H01J 37/32871
34/92
9,257,320 B2 * 2/2016 Fosnight ........... H01L 21/67775
(Continued)

FOREIGN PATENT DOCUMENTS

JP    2015-533026 A    11/2015
JP    2019-108220 A    7/2019
(Continued)

OTHER PUBLICATIONS

Extended European Search Report dated Mar. 4, 2024, of counterpart European Patent Application No. 21763225.6.
(Continued)

*Primary Examiner* — Avinash A Savani
*Assistant Examiner* — Dana K Tighe
(74) *Attorney, Agent, or Firm* — DLA Piper LLP (US)

(57) ABSTRACT

A storage shelf includes: a main frame; a plurality of shelf modules each having a base plate detachably provided on the main frame, and a supply nozzle provided on the base plate; a main pipe through which purge gas supplied from a supply source flows, and a first branch provided in the main pipe and branches a flow path from the main pipe, in which the shelf modules are each provided with a mass flow controller configured to adjust the flow rate of the purge gas supplied to the supply nozzle, the first branch is connected to a module pipe via an open/close valve that opens/closes the flow path, and the mass flow controller is connected to the module pipe.

16 Claims, 4 Drawing Sheets

(58) Field of Classification Search
USPC .......................................................... 454/193
See application file for complete search history.

(56) References Cited

U.S. PATENT DOCUMENTS

| | | | |
|---|---|---|---|
| 9,679,795 B2 * | 6/2017 | Otsuka | H01L 21/67769 |
| 10,006,894 B2 * | 6/2018 | Abe | G01N 33/0009 |
| 10,325,794 B2 | 6/2019 | Murata et al. | |
| 10,991,606 B2 * | 4/2021 | Fujiwara | H01L 21/67769 |
| 11,367,642 B2 * | 6/2022 | Kinoshita | H01L 21/67259 |
| 2015/0202664 A1 | 7/2015 | Murata et al. | |
| 2015/0235884 A1 | 8/2015 | Jang et al. | |
| 2016/0329225 A1 | 11/2016 | Bachlechner et al. | |
| 2019/0189486 A1 | 6/2019 | Abe et al. | |
| 2019/0326133 A1 | 10/2019 | Fujiwara et al. | |
| 2021/0272830 A1 | 9/2021 | Tsubaki et al. | |

FOREIGN PATENT DOCUMENTS

| | | |
|---|---|---|
| KR | 2015-0034272 A | 4/2015 |
| WO | 2015/166710 | 11/2015 |
| WO | 2018/150698 | 8/2018 |
| WO | 2020/017137 | 1/2020 |

OTHER PUBLICATIONS

International Search Report dated Mar. 30, 2021, of corresponding International Application No. PCT/JP2021/001632 along with an English translation.

English translation of the International Preliminary Report on Patentability dated Jun. 15, 2022, of corresponding International Application No. PCT/JP2021/001632.

* cited by examiner

STORAGE SHELF

TECHNICAL FIELD

This disclosure relates to a storage shelf.

BACKGROUND

Storage shelves are known that store containers such as reticle pods or Front Opening Unified Pods (FOUPs) in which items to be stored such as semiconductor wafers or glass substrates are stored. Such storage shelves may be provided with a storage shelf including a purging facility configured to supply purge gas such as inert gas or clean dry air to containers to maintain the cleanliness of the items to be stored. For example, Japanese Unexamined Patent Publication No. 2015-533026 discloses a shelf module including three shelves, in each of which a supply nozzle configured to supply purge gas is disposed. Each of a plurality of the shelf modules is configured to be supplied with the purge gas through a sub pipe branched from a main pipe.

In such storage shelves, components that are provided in a shelf module (e.g., a mass flow controller and a supply nozzle) may be replaced, or the shelf module itself may be replaced. Those replacements are collectively referred to simply as "shelf module replacement". In this instance, an operator closes a valve leading to a purge gas supply source to shut off distribution of purge gas flowing in the main pipe, and then removes the sub pipe from a branch. After removing the sub pipe, the operator seals a removal portion to prevent impurities from entering the main pipe from the removal portion.

Furthermore, after replacement work of a component is completed, it is necessary to allow purge gas to flow for a while to discharge impurities that may have been mixed in from the removal portion during the replacement (aging). In this instance, the impurities may be discharged not only from a replaced shelf module but also from a supply nozzle of another shelf module, and thus the operator needs to perform a task of removing a container placed on the other shelf module. Thus, in the above-described conventional devices, the operator has a heavy workload when replacing components that are provided in the shelf modules.

Therefore, it could be helpful to provide a storage shelf that can reduce the workload the operator has when replacing components that are provided in the shelf module.

SUMMARY

I thus provide a storage shelf including: a main frame; a plurality of shelf modules each having a base plate detachably provided on the main frame, and a supply nozzle provided on the base plate; a main pipe through which purge gas supplied from a supply source flows, and a first branch that is provided in the main pipe and branches a flow path from the main pipe, in which the shelf modules are each provided with a mass flow controller configured to adjust the flow rate of the purge gas supplied to the supply nozzle, the first branch is connected to a module pipe via an open/close valve for opening/closing the flow path, and the mass flow controller is connected to the module pipe.

In a storage shelf with this configuration, when replacing any one of the shelf modules, the operator does not need to shut off purge gas flowing through the main pipe or seal a removal portion, but only needs to remove the module pipe from the open/close valve after performing a simple task of closing the open/close valve. In addition, the storage shelf with this configuration prevents foreign matter from entering the main pipe when the open/close valve is closed before the module pipe is removed. Therefore, the operator does not need to perform aging for the main pipe, which was performed in the conventional storage shelf described above, but only needs to perform aging for the module pipe. This means that the operator does not need to remove containers disposed in other shelf modules during the aging, and after connecting the module pipe, but only needs to open the open/close valve and leave it open for a while. Thus, the storage shelf with this configuration can reduce the workload the operator has when replacing the components that are provided in the shelf modules.

The shelf module may be provided with a plurality of the supply nozzles and a plurality of the mass flow controllers corresponding to the respective supply nozzles, the storage shelf may further include a second branch that is provided in the module pipe and branches the flow path from the module pipe, and each of the mass flow controllers may be connected to the module pipe via the second branch.

In this configuration, even when each of the shelf modules is provided with the supply nozzles and the mass flow controllers, the operator only needs to disconnect the module pipe from the open/close valve after performing the simple task of closing the open/close valve, and after connecting the module pipe, only needs to open the open/close valve to simply leave it open for a while. Thus, the storage shelf with this configuration can reduce the workload the operator has when replacing the components that are provided in the shelf modules.

The module pipe and/or the open/close valve may be supported by the main frame. In this configuration, the operator can easily remove only the shelf module because the module pipe and/or the open/close valve remains in the main frame after removing the connection between the module pipe and the open/close valve.

The main frame may be a suspended member that is suspended from a ceiling or from a member fixed to the ceiling and be arranged in one direction, the base plate may be bridged over the main frame arranged in the one direction, and the module pipe and/or the open/close valve may be supported by a straddle member that is a different member from the base plate and that is bridged over the main frame arranged in the one direction. In this configuration, the operator can easily remove only the shelf module because the module pipe and/or the open/close valve remains in the main frame after removing the connection between the module pipe and the open/close valve.

The storage shelf may further include: a main wiring that is connected to a main controller or a power supply; a module wiring that is connected to the mass flow controller or the supply nozzle provided in the shelf module and that is connected to a detection sensor configured to detect a container; and a third branch that is provided in the main wiring, electrically branches from the main wiring, and detachably connects the module wiring. In this configuration, the operator can easily remove the shelf module by a simple task of removing the module wiring from the third branch.

It is thus possible to reduce the workload the operator has when replacing the components that are provided in the shelf module.

REFERENCE SIGNS LIST

Figure 1:
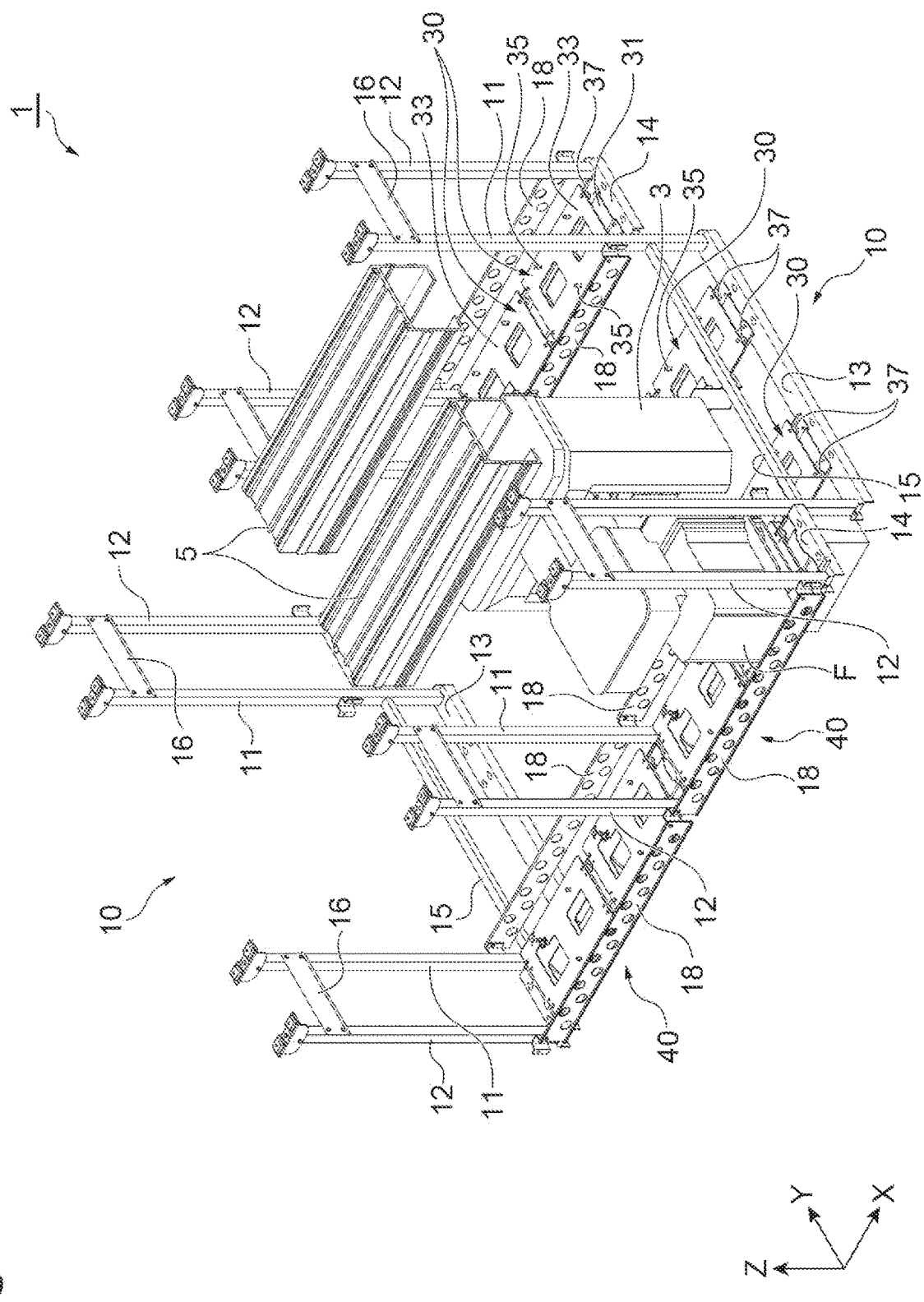
FIG. 1 is a perspective view illustrating a storage shelf according to one example.

1 Storage shelf
10 Main frame
18 Fall prevention fence (straddle member)
30 First shelf module
31 First shelf frame
33 First shelf plate
40 Second shelf module
41 Second shelf frame (base plate)
43 Second shelf plate
50 Purging facility
51 Supply nozzle
55 MFC (mass flow controller)
59 Detection sensor
60 Purge gas supply facility
61 Main pipe
62 First branch
62A Relay pipe
63 Module pipe
64 Open/close valve
65 Second branch
70 Wiring facility
71 Main wiring
72 Third branch
73 Module wiring
F Container

DETAILED DESCRIPTION

One suitable example of my storage shelf will be described in detail below with reference to the drawings. Like or equivalent elements are designated by like reference signs in the description of the drawings, and duplicate description is omitted. Terms "X-direction," "Y-direction," and "Z-direction" are for convenience based on illustrated directions. In FIG. 1, a purge gas supply facility 60 and a wiring facility 70 are omitted.

A storage shelf 1 illustrated in FIG. 1 is disposed along a track 5 of an overhead traveling car 3 that constitutes a semiconductor transfer system in a semiconductor manufacturing plant, for example. The storage shelf 1 temporarily stores a container F such as FOUPs or reticle pods in which items to be stored such as semiconductor wafers or glass substrates are stored. The storage shelf 1 includes a main frame 10, first shelf modules 30, second shelf modules (shelf modules) 40, the purge gas supply facility 60 (see FIG. 2), and the wiring facility 70 (see FIG. 4).

Figure 3:
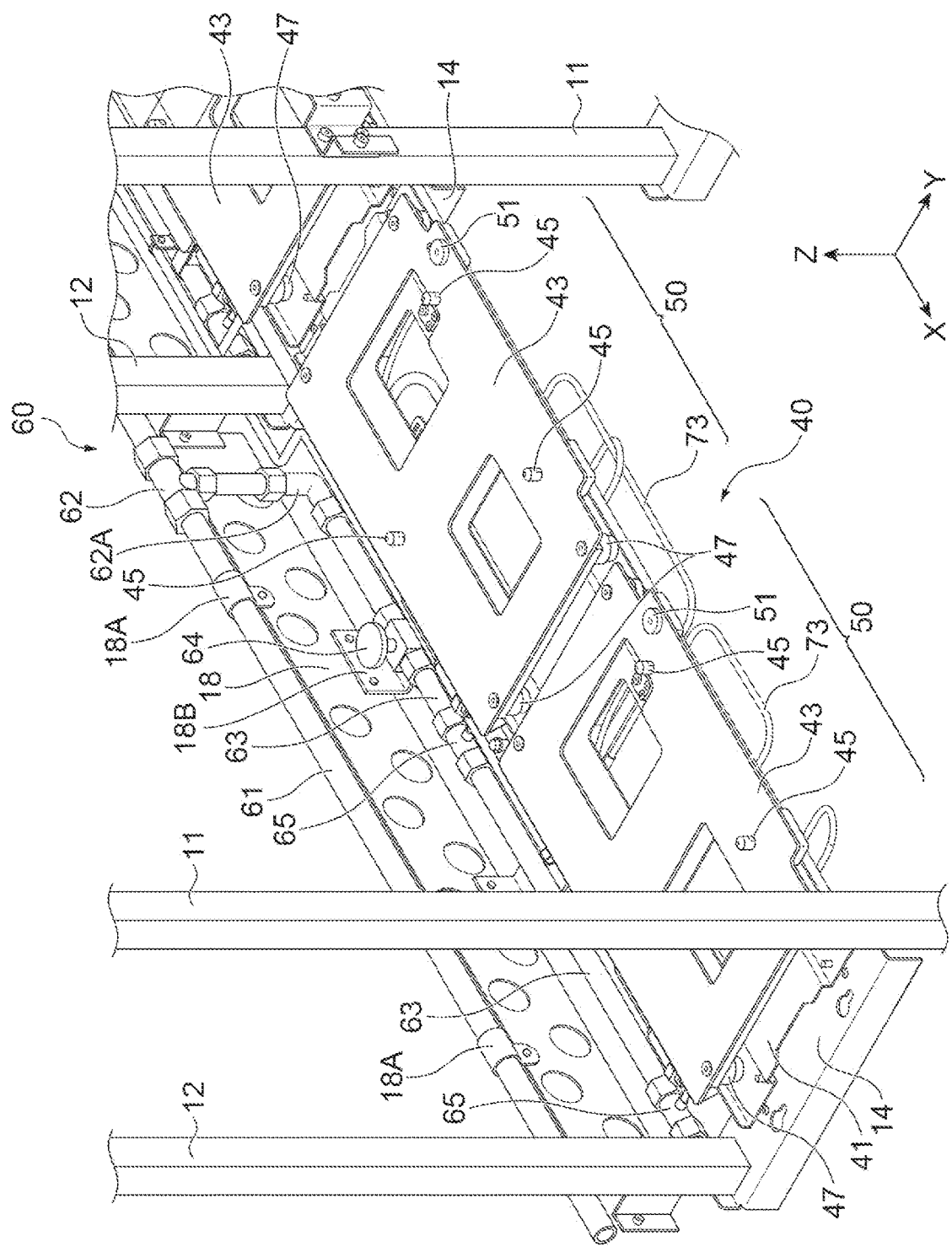
FIG. 3 is a perspective view illustrating the shelf module bridged over the main unit.

As illustrated in FIGS. 1 and 3, the main frame 10 is a member that suspends the first shelf module 30 and the second shelf module 40 from a ceiling. A plurality of the main frames 10 are arranged at equal intervals along the extension direction (X direction) of the track 5.

The main frame 10 has a pair of first suspending sections 11, 11, a first shelf support 13, a first connection 15, a pair of second suspending sections 12, 12, second shelf supports 14, second connections 16, and fall prevention fences 18.

The pair of first suspending sections 11, 11 are suspension members that extend from a fixed portion such as the ceiling. The first shelf support 13 connects lower ends of the pair of first suspending sections 11, 11. The first shelf support 13 extends along a short direction (Y direction) of the first shelf module 30 and supports the first shelf module 30 from below. The first connection 15 is connected at both ends thereof to the pair of first suspending sections 11, 11 and extends parallel (in the Y direction) to the first shelf support 13.

The pair of second suspending sections 12, 12 are suspension members that extend from a fixed portion such as the ceiling. The pair of second suspending sections 12, 12 are disposed to sandwich the pair of first suspending sections 11, 11 in the opposite direction of the first suspending sections 11, 11. The second shelf support 14 connects one of the pair of first suspending sections 11, 11 to a lower end of one of the pair of second suspending sections 12, 12. The second shelf support 14 extends along the short direction (Y direction) of the second shelf module 40 and supports the second shelf module 40 from below. The second connection 16 is connected to the first suspending section 11 at one end thereof and to the second suspending section 12 at the other end thereof, and extends parallel (Y direction) to the second shelf support 14.

The fall prevention fence 18 is a flat, straddle member hung between adjacent ones of the first suspending sections 11, 11 or between adjacent ones of the second suspending sections 12, 12. The fall prevention fences 18 are disposed to sandwich the container F placed on the first shelf module 30 or the second shelf module 40 from sides of the container F (Y direction). In other words, the fall prevention fences 18 are disposed to prevent the container F placed on the first shelf module 30 or the second shelf module 40 from falling from the first shelf module 30 or the second shelf module 40.

The first shelf module 30 is a member on which the container F is placed. The first shelf module 30 is a unit that does not have any purge function, i.e., a unit that does not have any function to supply gas to the container F to be placed on the first shelf module 30. The first shelf module 30 is hung between adjacent ones of the first shelf supports 13, 13 or between adjacent ones of the second shelf supports 14, 14.

The first shelf module 30 has a first shelf frame 31 and a first shelf plate 33. The first shelf frame 31 is hung between adjacent ones of the first shelf supports 13, 13 or between adjacent ones of the second shelf supports 14, 14 in the X direction. The first shelf frame 31 is a substantially rectangular plate-shaped member in plan view from the Z direction. The first shelf frame 31 is fixed to the first shelf support 13 or the second shelf support 14 by screws inserted from below into insertion holes in the first shelf support 13 or the second shelf support 14. Bolts and nuts may be used instead of the screws.

The first shelf plate 33 is supported on an upper surface of the first shelf frame 31 via an elastic body 37. The first shelf plate 33 is a substantially rectangular plate-shaped member in plan view from the Z direction. Examples of materials for the elastic body 37 include rubber material, silicone gel material, urethane gel, and a metal spring. The first shelf plate 33 has a mounting surface on which the container F is placed, and the mounting surface is provided with pins 35. Each of the pins 35 protrudes upward from the mounting surface of the first shelf plate 33. The pin 35 is disposed in a position corresponding to a positioning groove (not illustrated) on a bottom of the container F.

Figure 2:
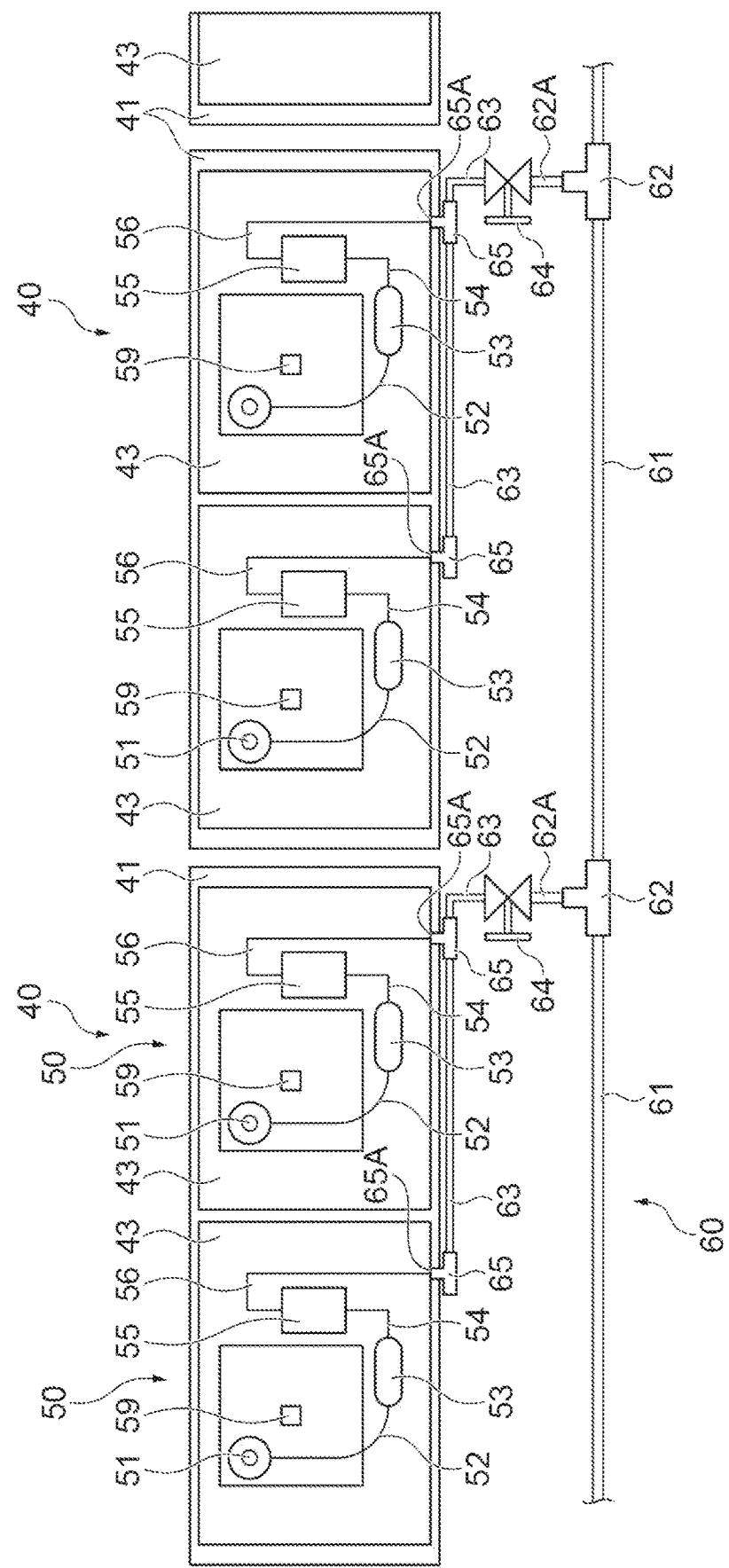
FIG. 2 is a configuration schematic diagram of shelf modules included in the storage shelf in FIG. 1.

As illustrated in FIGS. 1 to 3, the second shelf module 40 is a member on which the container F is placed. The second shelf module 40 is a unit with a purge function, i.e., a unit that supplies gas to the container F to be placed on the second shelf module 40. Examples of the gas include nitrogen gas, dry air and the like. The second shelf module 40 is hung between adjacent ones of the second shelf supports 14, 14.

The second shelf module 40 has a second shelf frame (base plate) 41, a second shelf plate 43, and a purging facility 50. The second shelf frame 41 is hung between adjacent ones of the second shelf supports 14, 14 in the X direction. The second shelf frame 41 is a substantially rectangular plate-shaped member in plan view from the Z direction.

The second shelf plate 43 is supported on the upper surface of the second shelf frame 41 via an elastic body 47. Examples of materials for the elastic body 47 include rubber material, silicone gel material, urethane gel, and a metal spring. The second shelf plate 43 is a substantially rectangular plate-shaped member in plan view from the Z direction. The two second shelf plates 43 are arranged along the X direction on the second shelf frame 41. That is, the second shelf module 40 has a plurality of supply nozzles 51 and a plurality of mass flow controllers (MFCs) 55.

The second shelf plate 43 has a mounting surface on which the container F is placed, and three pins 45 are provided for the single mounting surface. Each of the pins 45 protrudes upward from the mounting surface of the second shelf plate 43. The pin 45 is disposed in a position corresponding to a positioning groove (not illustrated) on the bottom of the container F.

The purging facility 50 has the supply nozzle 51, a first pipe 52, a filter section 53, a second pipe 54, the MFC 55, a third pipe 56, and a detection sensor 59.

The supply nozzle 51 is a nozzle that supplies gas to the interior of the container F. The supply nozzle 51 protrudes upward from the mounting surface of the second shelf plate 43 and is connected to an introduction hole on the bottom of the container F when the container F is placed on the supply nozzle 51. The first pipe 52 is a tubular member that connects the supply nozzle 51 to the filter section 53. The filter section 53 is a member housing a filter that removes foreign matter contained in gas that passes through the filter section 53, removing foreign matter contained in gas supplied from a supply source of the gas through the main pipe 61. The filter section 53 is fixed to the second shelf frame 41 by a suitable member. The second pipe 54 is a tubular member that connects the filter section 53 to the MFC 55.

The MFC 55 is a device that measures a flow rate of the gas supplied from the main pipe 61 and controls the flow rate. The MFC 55 is controlled by the main controller, which is not illustrated. The MFC 55 is provided on each of the second shelf plates 43. The MFC 55 is connected to a main wiring 71, which is connected to the main controller via a module wiring 73.

The main controller controls the MFC 55 to supply a predetermined flow rate of the gas to the container F when the container F is detected by the detection sensor 59, and controls the MFC 55 not to supply the gas to the container F when the container F is not detected by the detection sensor 59. The MFC 55 is fixed to an underside of the second shelf frame 41 by a suitable method.

The third pipe 56 is a tubular member that connects the MFC 55 to a second branch 65. An end of the third pipe 56 connected to the second branch 65 is provided with a pipe connector 65A that enables connection to the second branch 65, which is described in detail later.

The detection sensor 59 detects whether the container F is placed on the second shelf plate 43. The detection sensor 59 is provided on the mounting surface of the second shelf plate 43. The detection sensor 59 is controlled by the main controller, which is not illustrated. The detection sensor 59 is connected to the main wiring 71, which is connected to the main controller via the module wiring 73.

As illustrated in FIGS. 2 and 3, the purge gas supply facility 60 has the main pipe 61, a first branch 62, a relay pipe 62A, a module pipe 63, an open/close valve 64, and the second branch 65.

The main pipe 61 is connected to the supply source of the gas to be supplied to the purging facility 50. The main pipe 61 is a tubular member formed from metal such as stainless steel, or from resin such as fluorocarbon resin. The main pipe 61 is attached, via a mounting member 18A, to the fall prevention fence 18, which is hung between adjacent ones of the second suspending sections 12, 12.

The first branch 62 is provided in the main pipe 61 to branch the flow path from the main pipe 61. In this example, the first branches 62 are provided, the number of which corresponds to the number of the second shelf modules 40 with the purging facilities 50. One end of the relay pipe 62A is connected to the first branch 62. The other end of the relay pipe 62A is connected to the module pipe 63 via the open/close valve 64. The relay pipe 62A relays the purge gas flowing in the main pipe 61 to the module pipe 63.

The open/close valve 64 opens and closes the flow path from the relay pipe 62A to the module pipe 63. In other words, the module pipe 63 is connected to the first branch 62 via the open/close valve 64 that opens and closes the flow path. The module pipe 63 and the open/close valve 64 are supported by the fall prevention fence 18, which is hung between the adjacent ones of the second suspending sections 12, 12, via a bracket 18B.

The second branch 65 is provided in the module pipe 63 to branch the flow path from the module pipe 63. As described above, the second shelf module 40 is provided with the plurality of MFCs 55. Each of the MFCs 55 is connected to the module pipe 63 via the second branch 65. The end of the second branch 65, which is disposed at the most downstream section in the module pipe 63, is sealed so that the purge gas flows only to the MFC 55. In this example, the module pipe 63 is provided with the second branches 65, the number of which corresponds to the number of the MFCs 55. Each of the MFCs 55 is connected to the second branch 65 via the third pipe 56.

The above-described example describes that the second branches 65 are provided, the number of which corresponds to the number of MFCs 55. However, the second branches 65 the number of which is one less than the number of MFCs 55 may be disposed. In this example, the second branch 65, disposed at the most downstream section in the module pipe 63, is connected to the two MFCs 55 via the two third pipes 56.

Figure 4:
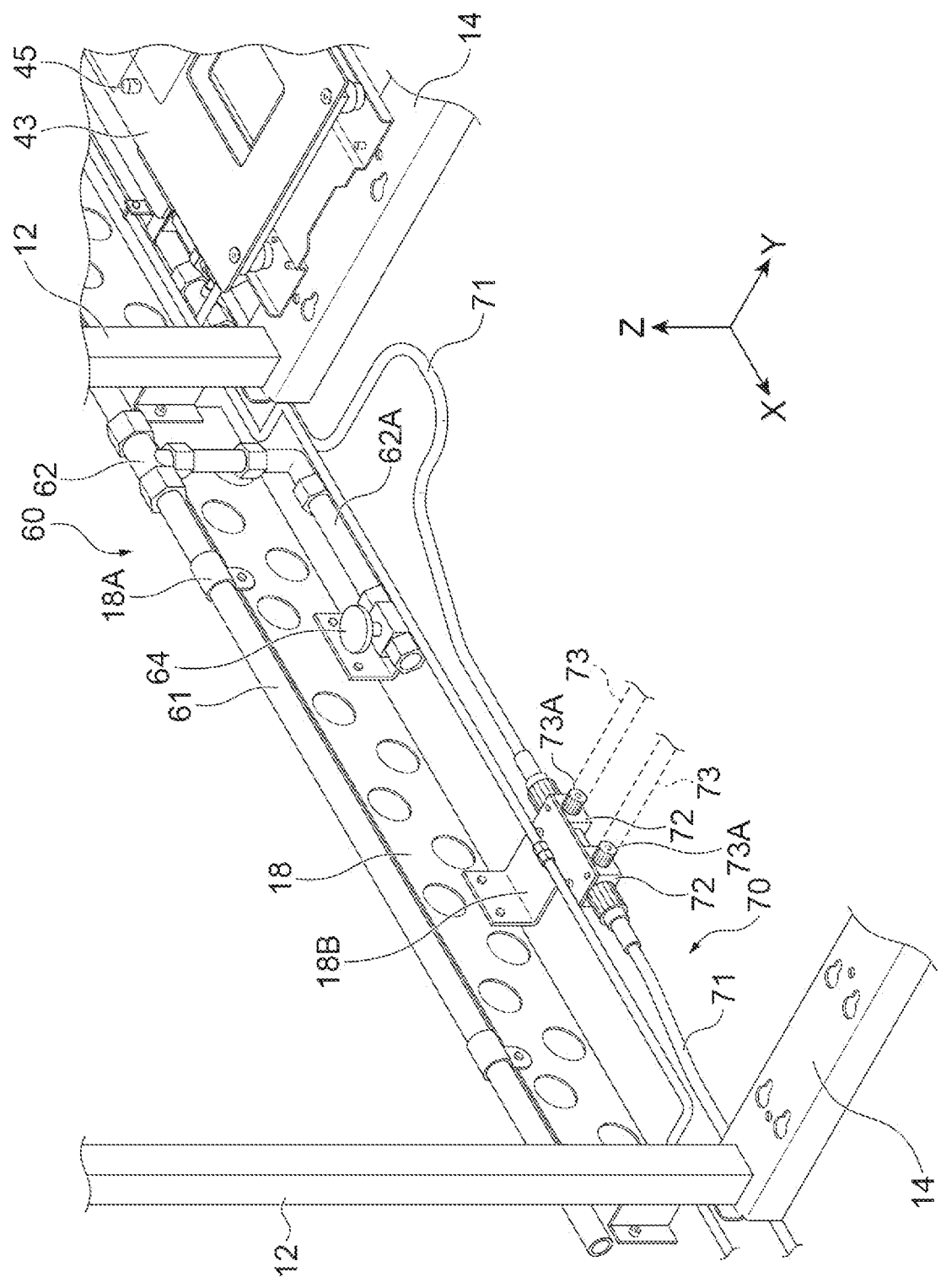
FIG. 4 is a perspective view illustrating a state in which the shelf module bridged over the main unit is removed.

As illustrated in FIG. 4, the wiring facility 70 has the main wiring 71, a third branch 72, and the module wiring 73.

The main wiring 71 is connected to the main controller that intensively controls the purging facilities 50. The main wiring 71 is supported by the fall prevention fence 18 hung between adjacent ones of the second suspending sections 12, 12, via the bracket 18B. The main controller may be fixed to part of the storage shelf 1, for example, or may be provided away from the storage shelf 1 via a relay device or the like.

The third branch 72 is provided in the main wiring 71, electrically branches from the main wiring 71, and detachably connects the module wiring 73. In this example, the third branches 72 are provided, the number of which is the same as the number of MFCs 55 (or the detection sensors 59) provided in the second shelf module 40. Each of the MFCs 55 (or the detection sensors 59) is connected to the module wiring 73 via the third branch 72.

The module wiring 73 connects the third branch 72 to the MFC 55 and also connects the third branch 72 to the detection sensor 59. The module wiring 73 is connected to the third branch 72 of the main wiring 71. At the end of the module wiring 73 that is connected to the third branch 72, a wiring connector 73A is provided that enables connection to the third branch 72. The main wiring 71 and the module wiring 73 have a function not only as communication lines for exchanging information, but also as power lines for exchanging power.

Next, a procedure for removing the second shelf module 40 from the main frame 10 is described. The operator first closes the open/close valve 64 illustrated in FIGS. 2 and 3. The operator then releases the bolts that fasten the second shelf frame 41, which is bridged over the second shelf support 14, and the second shelf support 14. The operator then removes the module pipe 63 from the open/close valve 64 or removes the third pipe 56 from the second branch 65. This completes a process of removing the second shelf module 40 from the main frame 10.

Next, the procedure for attaching the second shelf module 40 to the main frame 10 will be described. The operator bridges the second shelf module 40 to the second shelf support 14, and connects the module pipe 63 to the open/close valve 64 or connects the third pipe 56 to the second branch 65. Next, the operator fastens the second shelf frame 41 to the second shelf support 14 with the bolts. The operator then opens the open/close valve 64 and leaves it open for a while. This completes the aging of the second shelf module 40 that has been replaced. In other words, installation of the second shelf module 40 on the main frame 10 is completed.

Functional effects of the storage shelf 1 according to the above-described example will be described. In the storage shelf 1 of the above-described example, when replacing the second shelf module 40, the operator does not need to shut off the purge gas flowing through the main pipe 61 or seal the removal portion (in this example, the open/close valve 64 from which the module pipe 63 is removed or the second branch 65 from which the third pipe 56 is removed), but only needs to remove the module pipe 63 from the open/close valve 64 or remove the third pipe 56 from the second branch 65 after performing a simple task of closing the open/close valve 64. Moreover, in the storage shelf 1 with this configuration, since the open/close valve 64 is closed to prevent foreign matter from entering the main pipe 61, the operator does not need to perform aging for the main pipe 61, which is performed in the above-described conventional storage shelf, but only needs to perform aging for the module pipe 63. This means that the operator does not need to remove the containers F disposed in the other second shelf module 40 during the aging, and after connecting the module pipe 63, only needs to open the open/close valve 64 and leave it open for a while. Thus, the storage shelf 1 with this configuration can reduce the workload the operator has when replacing the second shelf module 40 or the components that are provided in the second shelf module 40 (e.g., the supply nozzle 51 or the MFC 55 or the like).

In the configuration of the storage shelf 1 of the above-described example, as illustrated in FIG. 2, even when each of the second shelf modules 40 is provided with a plurality of the supply nozzles 51 and the MFCs 55, the operator, after performing the simple task of closing the open/close valve 64, only needs to remove the module pipe 63 from the open/close valve 64 or remove the third pipe 56 from the second branch 65, and after connecting the module pipe 63, the operator only needs to open the open/close valve 64 to leave it open for awhile. Thus, the storage shelf 1 with this configuration can reduce the workload the operator has when replacing the second shelf module 40 or the components that are provided in the second shelf module 40.

In the above-described configuration of the storage shelf 1, as illustrated in FIG. 3, the module pipe 63 and the open/close valve 64 are supported by the fall prevention fence 18, which is hung between the adjacent ones of the second suspending sections 12, 12 of the main frame 10, via the bracket 18B. In this configuration, after disconnecting the connection between the module pipe 63 and the open/close valve 64, the open/close valve 64 remains on the bracket 18B provided on the fall prevention fence 18 of the main frame 10, and thus the operator can easily remove only the second shelf module 40. Moreover, in this configuration, after disconnecting the connection between the second branch 65 and the third pipe 56, the open/close valve 64 and the module pipe 63 remain on the bracket 18B provided on the fall prevention fence 18 of the main frame 10, and thus the operator can easily remove only the second shelf module 40.

In the configuration of the storage shelf 1 of the above-described example, the operator can easily remove the second shelf module 40 by a simple task of removing the module wiring 73 from the third branch 72.

Although one example has been described above, my storage shelves are not necessarily limited to the above-described example, and various modifications may be made without departing from the scope of this disclosure.

The above-described example describes that the two second shelf plates 43 (i.e., a place to place the container F where the supply nozzle 51 and the MFC 55 are provided) are provided on the main frame 10 via the second shelf frame 41. However, the main frame 10 may have a configuration in which only the single second shelf plate 43 is provided on the main frame 10 via the second shelf frame 41. In a configuration according to this modification, it is not necessary to provide the second branch 65 in the module pipe 63, and the module pipe 63 may be directly connected to the MFC 55. As in the above-described example, the single second branch 65 may be provided in the module pipe 63 to connect one of the branches to the MFC 55 and the other of the branches may be sealed.

In the above-described example and modifications, although selected configurations are described in which each of the two second shelf plates 43 is provided with the supply nozzles 51 and the MFC 55, the purging facility 50 such as the supply nozzle 51 and the MFC 55 may be provided directly on the second shelf frame 41.

In the above-described example and modifications, although the configuration is described in which the second shelf frame 41 is bridged over the main frame 10, the second shelf plate 43 may be removed from the second shelf frame 41. Even in this configuration, the same effects as in the above-described example and modifications can be obtained. The second shelf plate 43 in this configuration functions as abase plate attached to the main frame 10 via the second shelf frame 41.

In the above-described example and modifications, although a configuration is described in which the second shelf module 40 is detachably provided in the second shelf support 14 that connects the first suspending section 11 to the lower end of the second suspending section 12, the second shelf module 40 may be detachably installed in the first shelf support 13.

In the above-described example and modifications, although a configuration is described in which an upper end of each of the first suspending section 11 and the second suspending section 12 is fixed to a fixed part such as a ceiling, this disclosure is not limited thereto. For example, the respective upper ends of the first suspending section 11 and the second suspending section 12 may be fixed to a raceway or the like that allows each of the upper ends thereof to be able to slide by being unfastened.

In the above-described example and modifications, although a configuration is described in which the module pipe 63 and the open/close valve 64 are supported by the fall prevention fence 18 of the main frame 10, they may be supported in a state of bridging over the first suspending section 11 or the second suspending section 12.

The invention claimed is:

1. A storage shelf comprising:
a main frame;
a plurality of shelf modules each having a base plate detachably provided on the main frame, and a supply nozzle provided on the base plate;
a main pipe through which purge gas supplied from a supply source flows; and
a first branch provided in the main pipe and branches a flow path from the main pipe, wherein
the shelf modules are each provided with a mass flow controller configured to adjust a flow rate of the purge gas supplied to the supply nozzle,
the first branch is connected to a module pipe via an open/close valve that opens/closes the flow path,
the module pipe is connected to the supply nozzle via the mass flow controller,
the supply nozzle is connected to the main pipe via the open/close valve and the mass flow controller, and
the module pipe is detachably provided on the main frame.

2. The storage shelf according to claim 1, wherein
the shelf module is provided with a plurality of the supply nozzles and a plurality of the mass flow controllers corresponding to the respective supply nozzles,
the storage shelf further includes a second branch provided in the module pipe and branches the flow path from the module pipe, and
each of the mass flow controllers is connected to the module pipe via the second branch.

3. The storage shelf according to claim 2, wherein the module pipe and/or the open/close valve is supported by the main frame.

4. The storage shelf according to claim 3, wherein
the main frame is a suspended member suspended from a ceiling or from a member fixed to the ceiling and is arranged in one direction,
the base plate is bridged over the main frame arranged in the one direction, and
the module pipe and/or the open/close valve is supported by a straddle member that is a different member from the base plate and that is bridged over the main frame arranged in the one direction.

5. The storage shelf according to claim 4, further comprising:
a main wiring connected to a main controller or a power supply;
a module wiring connected to the mass flow controller or the supply nozzle provided in the shelf module and connected to a detection sensor configured to detect a container; and
a third branch provided in the main wiring, electrically branches from the main wiring, and detachably connects the module wiring.

6. The storage shelf according to claim 3, further comprising:
a main wiring connected to a main controller or a power supply;
a module wiring connected to the mass flow controller or the supply nozzle provided in the shelf module and connected to a detection sensor configured to detect a container; and
a third branch provided in the main wiring, electrically branches from the main wiring, and detachably connects the module wiring.

7. The storage shelf according to claim 2, wherein
the main frame is a suspended member suspended from a ceiling or from a member fixed to the ceiling and is arranged in one direction,
the base plate is bridged over the main frame arranged in the one direction, and
the module pipe and/or the open/close valve is supported by a straddle member that is a different member from the base plate and that is bridged over the main frame arranged in the one direction.

8. The storage shelf according to claim 7, further comprising:
a main wiring connected to a main controller or a power supply;
a module wiring connected to the mass flow controller or the supply nozzle provided in the shelf module and connected to a detection sensor configured to detect a container; and
a third branch provided in the main wiring, electrically branches from the main wiring, and detachably connects the module wiring.

9. The storage shelf according to claim 2, further comprising:
a main wiring connected to a main controller or a power supply;
a module wiring connected to the mass flow controller or the supply nozzle provided in the shelf module and connected to a detection sensor configured to detect a container; and
a third branch provided in the main wiring, electrically branches from the main wiring, and detachably connects the module wiring.

10. The storage shelf according to claim 1, wherein the module pipe and/or the open/close valve is supported by the main frame.

11. The storage shelf according to claim 10, wherein
the main frame is a suspended member suspended from a ceiling or from a member fixed to the ceiling and is arranged in one direction,
the base plate is bridged over the main frame arranged in the one direction, and
the module pipe and/or the open/close valve is supported by a straddle member that is a different member from the base plate and that is bridged over the main frame arranged in the one direction.

12. The storage shelf according to claim 11, further comprising:
a main wiring connected to a main controller or a power supply;
a module wiring connected to the mass flow controller or the supply nozzle provided in the shelf module and connected to a detection sensor configured to detect a container; and a third branch provided in the main wiring, electrically branches from the main wiring, and detachably connects the module wiring.

13. The storage shelf according to claim 10, further comprising:
   a main wiring connected to a main controller or a power supply;
   a module wiring connected to the mass flow controller or the supply nozzle provided in the shelf module and connected to a detection sensor configured to detect a container; and
   a third branch provided in the main wiring, electrically branches from the main wiring, and detachably connects the module wiring.

14. The storage shelf according to claim 1, wherein
   the main frame is a suspended member suspended from a ceiling or from a member fixed to the ceiling and is arranged in one direction,
   the base plate is bridged over the main frame arranged in the one direction, and
   the module pipe and/or the open/close valve is supported by a straddle member that is a different member from the base plate and that is bridged over the main frame arranged in the one direction.

15. The storage shelf according to claim 14, further comprising:
   a main wiring connected to a main controller or a power supply;
   a module wiring connected to the mass flow controller or the supply nozzle provided in the shelf module and connected to a detection sensor configured to detect a container; and
   a third branch provided in the main wiring, electrically branches from the main wiring, and detachably connects the module wiring.

16. The storage shelf according to claim 1, further comprising:
   a main wiring connected to a main controller or a power supply;
   a module wiring connected to the mass flow controller or the supply nozzle provided in the shelf module and connected to a detection sensor configured to detect a container; and
   a third branch provided in the main wiring, electrically branches from the main wiring, and detachably connects the module wiring.

\* \* \* \* \*